United States Patent [19]

Uya

[11] Patent Number: 4,506,168
[45] Date of Patent: Mar. 19, 1985

[54] SCHMITT TRIGGER CIRCUIT

[75] Inventor: Masaru Uya, Kadoma, Japan

[73] Assignee: Matsushita Electric Industrial Co., Ltd., Osaka, Japan

[21] Appl. No.: 397,419

[22] Filed: Jul. 12, 1982

[30] Foreign Application Priority Data

Nov. 2, 1981 [JP] Japan .................................. 56-176088

[51] Int. Cl.³ ...................... H03K 5/153; H03K 3/356
[52] U.S. Cl. ..................................... 307/290; 307/359
[58] Field of Search ........................ 307/290, 354, 359

[56] References Cited

U.S. PATENT DOCUMENTS 4,063,119 12/1977 Odell et al. .......................... 307/290

Primary Examiner—John Zazworsky
Attorney, Agent, or Firm—Stevens, Davis, Miller & Mosher

[57] ABSTRACT

A Schmitt trigger circuit uses an inverter and at least four transistors connected so as to ensure that its threshold voltages can optionally be set, its hysteresis voltage width can be sufficiently broad, and flow of steady-state current can be prevented.

6 Claims, 8 Drawing Figures

SCHMITT TRIGGER CIRCUIT

BACKGROUND OF THE INVENTION

This invention generally relates to a Schmitt trigger circuit comprised of complementary MOS transistors and more particularly to a Schmitt trigger circuit using an inverter and at least four transistors connected so as to ensure that its threshold voltages can optionally be set and its hysteresis voltage width can be sufficiently broad.

In a conventional Schmitt trigger circuit of complementary MOS (called CMOS hereinafter) transistors as shown in FIG. 1 comprises P-channel enhancement MOS transistors $P_1$ to $P_4$, and N-channel enhancement MOS transistors $N_1$ and $N_2$. The transistors $P_1$ and $N_1$ are coupled to constitute one inverter, the transistors $P_4$ and $N_2$ are coupled to constitute the other inverter, and the transistor $P_2$ is in diode connection. When an input voltage $V_{IN}$ changes from "0" to "1" (from GND to $V_{DD}$), an output voltage $V_{OUT}$ is initially "0" and hence the transistor $P_3$ is rendered on (saturated). Accordingly, the transistor $P_1$ has then a source voltage which approximates the power source voltage $V_{DD}$. Conversely, when the input voltage $V_{IN}$ changes from "1" to "0" (from $V_{DD}$ to GND), the output voltage $V_{OUT}$ is initially "1" until the transistor $P_3$ is rendered off so that the transistor $P_1$ has a source voltage which is affected by the transistor $P_2$ in diode connection and which is decreased from the power source voltage $V_{DD}$ by a voltage $V_{TP}$ (threshold voltage of the transistor $P_2$). Consequently, an inversion voltage $V_{IL}$ of the output voltage $V_{OUT}$ upon the change of the input voltage $V_{IN}$ from "1" to "0" decreases below an inversion voltage $V_{IH}$ upon the change from "0" to "1", providing a hysteresis characteristic in an input/output voltage characteristic as shown in FIG. 2.

With the conventional circuit of FIG. 1, however, the degree of freedom for setting the inversion voltages $V_{IL}$ and $V_{IH}$ is restricted, particularly, the hysteresis voltage ($V_{IH} - V_{IL}$) is limited to about 0.2 volts and the application of this circuit is limited to particular fields.

SUMMARY OF THE INVENTION

The present invention intends to obviate the above conventional drawbacks and has for its object to provide a Schmitt trigger circuit wherein inversion voltages $V_{IL}$ and $V_{IH}$ can be set optionally within a wide range and a hysteresis voltage width can be sufficiently broad.

DESCRIPTION OF THE PREFERRED EMBODIMENT

Figure 1:
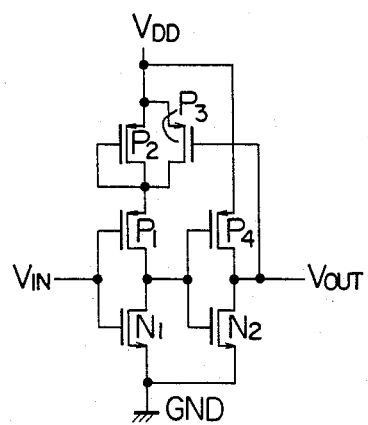
FIG. 1 is a circuit diagram of a conventional Schmitt trigger circuit.
Figure 2:
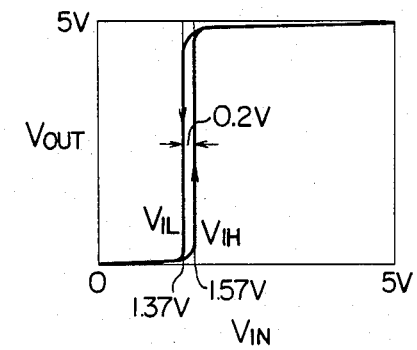
FIG. 2 illustrates an input/output characteristic of the FIG. 1 circuit.
Figure 3:
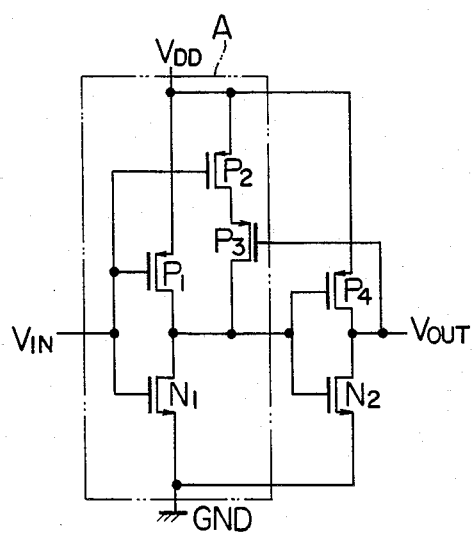
FIG. 3 is a circuit diagram showing one embodiment of a Schmitt trigger circuit according to the invention.

A Schmitt trigger circuit embodying the invention as shown in FIG. 3 comprises P-channel enhancement MOS transistors $P_1$ to $P_4$, a substrate of which is connected to power source voltage $V_{DD}$, and N-channel enhancement MOS transistors $N_1$ and $N_2$ having a substrate connected to earth potential GND, the source of these transistors being designated by an arrow. The transistors $P_2$ and $P_3$ are connected in series and the transistor $P_1$ is connected in parallel with the series connection. An input voltage $V_{IN}$ is applied to a gate of each of the transistors $N_1$, $P_1$ and $P_2$, and an output voltage $V_{OUT}$ is fedback to a gate of the transistor $P_3$.

Denoting an inversion voltage (an input voltage value at which the output voltage is inverted) by V, the following equation generally stands:

$$V = \frac{V_{DD} + \gamma V_{Tn} - |V_{Tp}|}{\gamma + 1} \quad (1)$$

where $$\gamma = \sqrt{\frac{\mu_n}{\mu_p}} \cdot \sqrt{\frac{W_n}{l_n}} / \sqrt{\frac{W_p}{l_p}}, \quad (2)$$

$V_{Tn}$ and $V_{Tp}$ a threshold voltages of the N-channel and P-channel transistors, $\mu_n$ and $\mu_p$ are average surface mobilities of electron and positive hole in the channels, Wn and Wp are widths of the N-channnel and P-channel transistors, and ln and lp are gate lengths of the N-channel and P-channel transistors. Equation (1) is held on condition that the N-channel and P-channel transistors have gate oxide films of the same thickness.

Assuming that $V_{Tn} = |V_{Tp}| = V_T$ and ln=lp, equations (1) and (2) are reduced to, $$V = \frac{V_{DD} + (\gamma - 1)V_T}{\gamma + 1} \quad (1)'$$

and $$\gamma = \sqrt{\frac{\mu_n}{\mu_p}} \cdot \sqrt{\frac{W_n}{W_p}} \quad (2)'$$

From equations (1)' and (2)', it will be seen that the inversion voltage V changes with a ratio between the gate widths, Wn/Wp, and it decreases as the ratio Wn/Wp increases and conversely increases as the ratio decreases.

Specifically, assuming that the gate widths of the transistors $P_1$, $P_2$ and $P_3$ are $W_{p1}$, $W_{p2}$ and $W_{p3}$, respectively, and all the transistors have an identical gate length of l in the FIG. 3 embodiment in which when the input voltage $V_{IN}$ changes from "0" (low voltage level) to "1" (high voltage level), the output voltage $V_{out}$ is initial "0" together with the initially input voltage $V_{IN}$ so that the transistors $P_1$, $P_2$ and $P_3$ are rendered on (saturated), a first-stage circuit A is equivalent to an inverter comprised of a P-channel transistor having a gate width Wp equal to $W_{p1} + W_{p2} \cdot W_{p3}/(W_{p2} + W_{p3})$ and the transistor $N_1$. It is also assumed that the gate width Wn of the transistor $N_1$ is $W_{N1}$. Then, when, upon the change of the input voltage $V_{IN}$ from "0" to "1", the input voltage $V_{IN}$ exceeds an inversion voltage $V = V_{IH}$ which is determined from equation (1)' by substituting $W_{p1} + W_{p2} \cdot W_{p3}/(W_{p2} + W_{p3})$ for $W_p$ and $W_{N1}$ for $W_N$ in equation (2)', the output of the first-stage circuit A changes from "1" to "0" and an inverter of the succeeding stage comprised of the transistors $P_4$ and $N_2$ is inverted so as to cause the output voltage $V_{OUT}$ to change from "0" to "1". This change in the output voltage $V_{OUT}$ turns off the transistor $P_3$ and as a result, the first stage circuit A acts as an inverter simply comprised of the transistors $N_1$ and $P_1$. In this state, an inversion voltage $V = V_{IL}$ stands which is determined from equation (1)' by substituting $W_{p1}$ for $W_p$ and $W_{N1}$ for $W_N$ in equation (2)'.

Subsequently, when the input voltage $V_{IN}$ changes from "1" to "0", the input and output voltages $V_{IN}$ and $V_{OUT}$ initially assume "1" and hence the transistor $N_1$ is rendered on and the transistors $P_1$, $P_2$ and $P_3$ are rendered off. Particularly, the transistor $P_3$ being under the control of the output voltage $V_{OUT}$ is kept turned off until the first stage circuit A is inverted, followed by inversion of the succeeding inverter for causing the output voltage $V_{OUT}$ to assume "0". Accordingly, the first stage circuit A still remains as the inverter simply comprised of the transistors $N_1$ and $P_1$. Obviously, the output voltage changes from "1" to "0" at the inversion voltage $V = V_{IL}$ which is determined from equation (1)' by substituting $W_{p1}$ for $W_p$ and $W_{N1}$ in equation (2)'. It will be readily seen that after the first stage circuit A has been inverted, the inversion voltage V recovers the $V_{IH}$.

Figure 4:
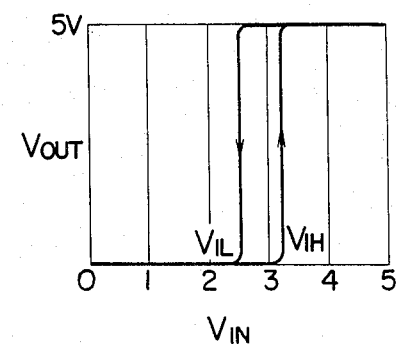
FIG. 4 illustrates an input/output characteristic of the FIG. 3 circuit.

As will be seen from the above operational description, the relation $V_{IL} < V_{IH}$ is established between the inversion voltage $V_{IH}$ for the change of the input voltage $V_{IN}$ from "0" to "1" and the inversion voltage $V_{IL}$ for the change from "1" to "0", thus providing a hysteresis characteristic as shown in FIG. 4. In other words, the inversion voltage $V_{IL}$ depends on a ratio between equivalent transconductance gm values of the transistors $P_1$ and $N_1$ and the inversion voltage $V_{IH}$ depends on an equivalent transconductance gm ratio between the transistors $P_1$ to $P_3$ and the transistor $N_1$. By making the gate width of the transistors $P_2$ and $P_3$ larger than that of the transistor $P_1$, the hysteresis voltage ($V_{IH} - V_{IL}$) can be increased.

Figure 5:
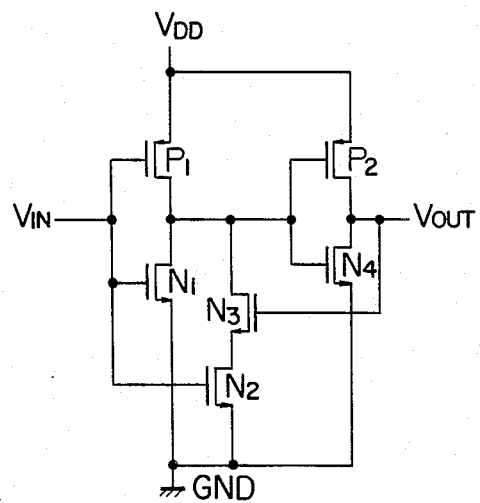
FIG. 5 is a circuit diagram showing another embodiment of the invention.
Figure 6:
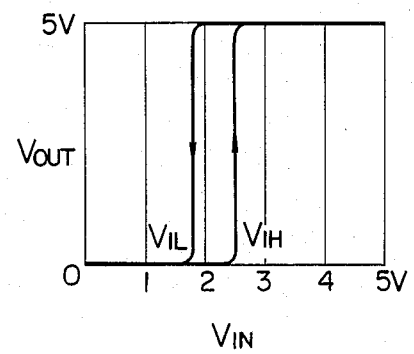
FIG. 6 illustrates an input/output characteristic of the FIG. 5 embodiment.

In another embodiment of the present invention as shown in FIG. 5, P and N channel transistors in the FIG. 3 embodiment are exchanged for each other, whereby the equivalent gm (or gate width W) of an N-channel transistors of a first-stage inverter is changed so as to produce a hysteresis characteristic based on the same operation principle as that of the FIG. 3 circuit, thereby providing an input/output characteristic as shown in FIG. 6.

In this embodiment of FIG. 5, an inversion voltage $V_{IH}$ is determined by equivalent gm values of transistors $P_1$ and $N_1$.

Where it is desired to set the inversion voltages $V_{IL}$ and $V_{IH}$ above $V_{DD}/2$, the FIG. 3 embodiment should preferably be implemented; conversely, when setting values of the inversion voltages desirably below $V_{DD}/2$, the FIG. 5 embodiment is preferred.

Although, in the series connection of the FIG. 3 embodiment, the transistor $P_2$ is connected to the power source side and the transistor $P_3$ is connected to the grounding side, this connection relationship may be reversed.

Figure 7:
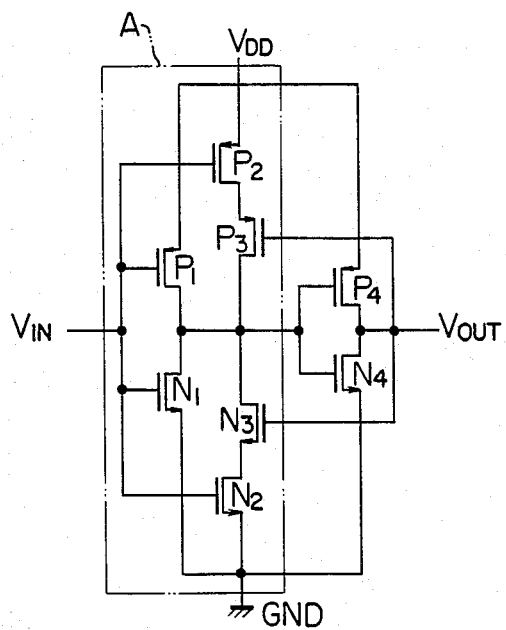
FIG. 7 is a circuit diagram of still another embodiment of the invention.

Turning to FIG. 7, there is shown still another embodiment of the present invention wherein P-channel enhancement MOS transistors $P_1$ to $P_4$ have their substrate connected to a power source voltage $V_{DD}$ (for example, +5 volts) and N-channel enhancement MOS transistors $N_1$ to $N_4$ have their substrate connected to earth potential GND, the source of these transistors being designated by an arrow. The transistors $P_4$ and $N_4$ constitute an inverter.

A circuit of this embodiment comprises the circuits of the FIG. 3 and FIG. 5 embodiments in combination to provide a larger hysteresis voltage ($V_{IH} - V_{IL}$), and operates based on the same principle as the FIG. 3 embodiment.

When an input voltage $V_{IN}$ changes from "0" to "1" (0 volt to +5 volts) in this embodiment of FIG. 5, an output voltage $V_{OUT}$ initially assumed "0" and the transistor $N_3$ is rendered off and the transistor $P_3$ is rendered on (saturated) so that in a first-stage circuit A (enclosed by dotted line) the transistors $P_1$ and $P_2$ act as an equivalent P-channel transistor. Assuming that all the transistors have an identical gate length l, an equivalent gate width of the equivalent P-channel transistor is represented by $W_{p1} + W_{p2} \cdot W_{p3}/(W_{p2} + W_{p3})$. In contrast, since the transistor $N_3$ is off and the transistor $N_2$ stands ineffective, only the transistor $N_1$ acts as an equivalent N-channel transistor in the first stage circuit A, having an equivalent gate width $W_{N1}$. Consequently, an equivalent gate width ratio $W_N/W_p$ is, $$W_{N1}/W_{p1} + W_{p2} \cdot W_{p3}/(W_{p2} + W_{p3}) \qquad (3).$$

Conversely, when the input voltage $V_{IN}$ changes from "1" to "0" (+5 volts to 0 volt), the output voltage $V_{OUT}$ initially assumes "1" and the transistor $P_3$ is rendered off and the transistor $N_3$ is rendered on (saturated) so that the transistors $N_1$ and $N_2$ in the first-stage circuit A act as an equivalent N-channel transistor having an equivalent gate width of $W_{N1} + W_{N2} \cdot W_{N3}/(W_{N2} + W_{N3})$. In contrast, since the transistor $P_3$ is off and the transistor $P_2$ stands ineffective, only the transistor $P_1$ acts as an equivalent P-channel transistor in the first stage circuit A, having an equivalent gate width $W_{p1}$. Consequently, an equivalent gate width ratio $W_N/W_p$ is, $$(W_{N1} + W_{N2} \cdot W_{N3}/(W_{N2} + W_{N3}))/W_{p1} \qquad (4)$$

When comparing the gate width ratio represented by equation (3) for the change of input voltage $V_{IN}$ from "0" to "1" with the gate width ratio of equation (4) for the change from "1" to "0", (3) < (4) stands obviously.

Figure 8:
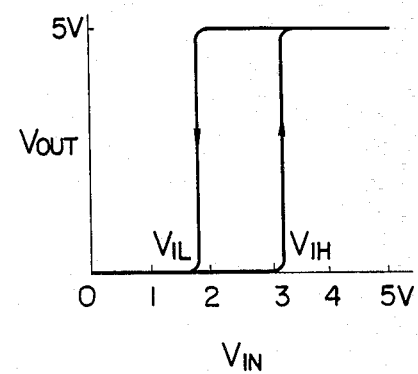
FIG. 8 illustrates an input/output characteristic of the FIG. 7 embodiment.

Therefore, when considering equations (1)' and (2)' from the standpoint of this relationship (3) < (4), $V_{IL} < V_{IH}$ is held between an inversion voltage $V_{IH}$ upon the change of input voltage $V_{IN}$ from "0" to "1" and an inversion voltage $V_{IL}$ upon the change from "1" to "0", thus providing a hysteresis characteristic as shown in FIG. 8. In other words, the inversion voltage $V_{IL}$ depends on a ratio between equivalent transconductance gm values of the transistor $P_1$ and the transistors $N_1$ to $N_3$ and the inversion voltage $V_{IH}$ depends on a ratio between equivalent transconductance gm values of the transistors $P_1$ to $P_3$ and the transistor $N_1$. By making the gate width of the transistors $P_2$ and $P_3$ and transistors $N_2$ and $N_3$ larger than that of the transistors $P_1$ and $N_1$, the hysteresis voltage ($V_{IH} - V_{IL}$) can be increased. As will be seen from the above description, the position of the inversion voltages $V_{IL}$ and $V_{IH}$ can be set readily and optionally by suitably determining the ratio of the gate width W between the transistors $N_1$ to $N_3$ and the transistors $P_1$ to $P_3$.

Although, in the embodiment of FIG. 7, the transistor $P_2$ of the series connection of transistors $P_2$ and $P_3$ is connected to the power source side and the transistors $N_2$ and $N_3$ are connected to the grounding side, this connection relationship may be reversed.

As has been described, the present invention provides a Schmitt trigger circuit having inversion voltages $V_{IL}$ and $V_{IH}$ within a broad range and a broad hysteresis voltage ($V_{IH}-V_{IL}$) as compared with conventional circuits. This simplified Schmitt trigger circuit is easy to design and has versatility in application to CMOS integrated circuits.

I claim:

1. A Schmitt trigger circuit comprising:
a first transistor of a first conductivity type;
a series connection of second and third transistors of said first conductivity type;
a fourth transistor of a second conductivity type; and
an inverter;
a source of said first transistor and one end of said series connection being connected to a first voltage source, a source of said fourth transistor being connected to a second voltage source, drains of said first and fourth transistors and the other end of said series connection being connected to an input terminal of said inverter, a gate of said third transistor being connected to an output terminal of said inverter, and gates of said first and second transistors being connected to a gate of said fourth transistor, whereby an input voltage supplied to the gate of said fourth transistor produces an output voltage from the output terminal of said inverter.

2. A Schmitt trigger circuit according to claim 1 wherein said first, second and third transistors are P-channel enhancement MOS transistors, and said fourth transistor is an N-channel enhancement MOS transistor.

3. A Schmitt trigger circuit according to claim 1 wherein said first, second and third transistors are N-channel enhancement MOS transistors, and said fourth transistor is a P-channel enhancement MOS transistor.

4. A Schmitt trigger circuit comprising:
a first transistor of a first conductivity type;
a first series connection of second and third transistors of said first conductivity type;
a fourth transistor of a second conductivity type;
a second series connection of fifth and sixth transistors of said second conductivity type; and
an inverter;
a source of said first transistor and one end of said first series connection being connected to a first voltage source, a source of said fourth transistor and one end of said second series connection being connected to a second voltage source, drains of said first and fourth transistors, the other end of said first series connection, and the other end of said second series connection being connected to an input terminal of said inverter, gates of said third and sixth transistors being connected to an output terminal of said inverter, and gates of said second, fourth and fifth transistors being connected to a gate of said first transistor, whereby an input signal supplied to the gate of said first transistor produces an output signal from the output terminal of said inverter.

5. A Schmitt trigger circuit according to claim 4 wherein said first, second and third transistors are P-channel enhancement MOS transistors, and said fourth, fifth and sixth transistors are N-channel enhancement MOS transistors.

6. A Schmitt trigger circuit according to claim 4 wherein said one end of said first series connection corresponds to the source of said second transistor, said the other end thereof corresponds to the drain of said third transistor, said one end of said second series connection corresponds to the source of said fifth transistor, and said other end thereof corresponds to the drain of said sixth transistor.

* * * * *